(12) United States Patent
Jiang et al.

(10) Patent No.: US 7,374,438 B2
(45) Date of Patent: May 20, 2008

(54) ELECTRONIC APPARATUS INCORPORATING LATCH MECHANISM

(75) Inventors: Xiao-Gang Jiang, Shenzhen (CN); Song Deng, Shenzhen (CN); Hung-Chun Lu, Tu-Cheng (TW); Wen-Kang Lo, Tu-Cheng (TW); Chien-Li Tsai, Tu-Cheng (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 42 days.

(21) Appl. No.: 11/309,146

(22) Filed: Jun. 28, 2006

(65) Prior Publication Data
US 2007/0077788 A1    Apr. 5, 2007

(30) Foreign Application Priority Data
Jul. 9, 2005   (CN) .................. 2005 2 0061392

(51) Int. Cl.
*H01R 13/44* (2006.01)

(52) U.S. Cl. .................. 439/135; 361/683; 292/8
(58) Field of Classification Search ........ 439/135–138; 361/681, 683; 292/8, 30
See application file for complete search history.

(56) References Cited

U.S. PATENT DOCUMENTS

| | | | | |
|---|---|---|---|---|
| 6,108,196 A | * | 8/2000 | Jung | 361/683 |
| 6,115,239 A | * | 9/2000 | Kim | 361/681 |
| 2006/0082962 A1 | * | 4/2006 | Peng et al. | 361/683 |

FOREIGN PATENT DOCUMENTS

TW            482309         4/2002

* cited by examiner

*Primary Examiner*—Tho D. Ta
(74) *Attorney, Agent, or Firm*—Wei Te Chung (57) ABSTRACT

An electronic apparatus includes a cover, a latch fixable to the cover and a base pivotally connectable with the cover. The latch includes a hook having a shank portion and a hook portion extending from the shank portion, and the shank portion defines a slanted surface thereon. The base includes a retaining portion engagable with the hook portion of the latch for fixing the cover to the base, and a stopper portion along which the slanted surface of the shank portion is slid thereby causing the cover to lift away from the base.

11 Claims, 9 Drawing Sheets

ELECTRONIC APPARATUS INCORPORATING LATCH MECHANISM

FIELD OF THE INVENTION

The present invention relates to an electronic apparatus, and more particularly to an electronic apparatus having a latch mechanism.

DESCRIPTION OF RELATED ART

An electronic apparatus such as a notebook computer or laptop computer usually includes a base and a cover fixable to the base. Taiwan Patent No. 482309 discloses such an electronic apparatus, in which a cover is fixed to a base with a latch. To open the cover, the latch is operated to unlatch the cover from the base then a user must grasp a side of the cover and pivotally open the electronic apparatus. It is difficult to lift the cover in this manner because there is nothing to help the user get a grasp on the cover to lift it.

What is desired, therefore, is an electronic apparatus having a latch mechanism which better facilitates opening a cover thereof.

SUMMARY OF THE INVENTION

An electronic apparatus includes a cover, a latch fixable to the cover, and a base pivotally connectable with the cover. The latch includes a hook having a shank portion and a hook portion extendable from the shank portion, and the shank portion defines a slanted surface thereon. The base includes a retaining portion engagable with the hook portion of the latch for fixing the cover to the base, and a stopper portion along which the slanted surface of the shank portion is movable thereby causing the cover to lift away from the base.

Other advantages and novel features will become more apparent from the following detailed description of preferred embodiments when taken in conjunction with the accompanying drawings, in which:

DETAILED DESCRIPTION OF THE INVENTION

Figure 1:
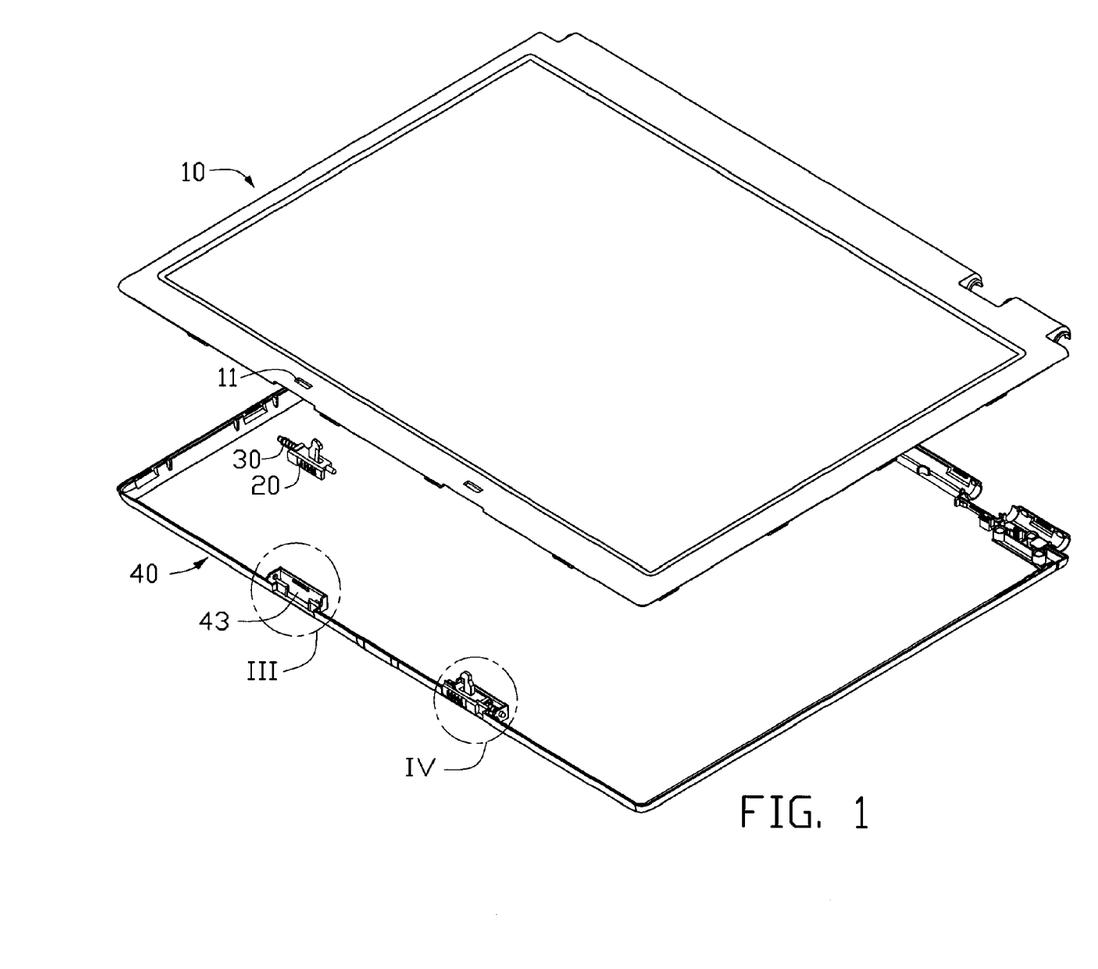
FIG. 1 is an exploded, inverted, isometric view of a cover and a latch of an electronic apparatus in accordance with a first preferred embodiment of the present invention.
Figure 6:
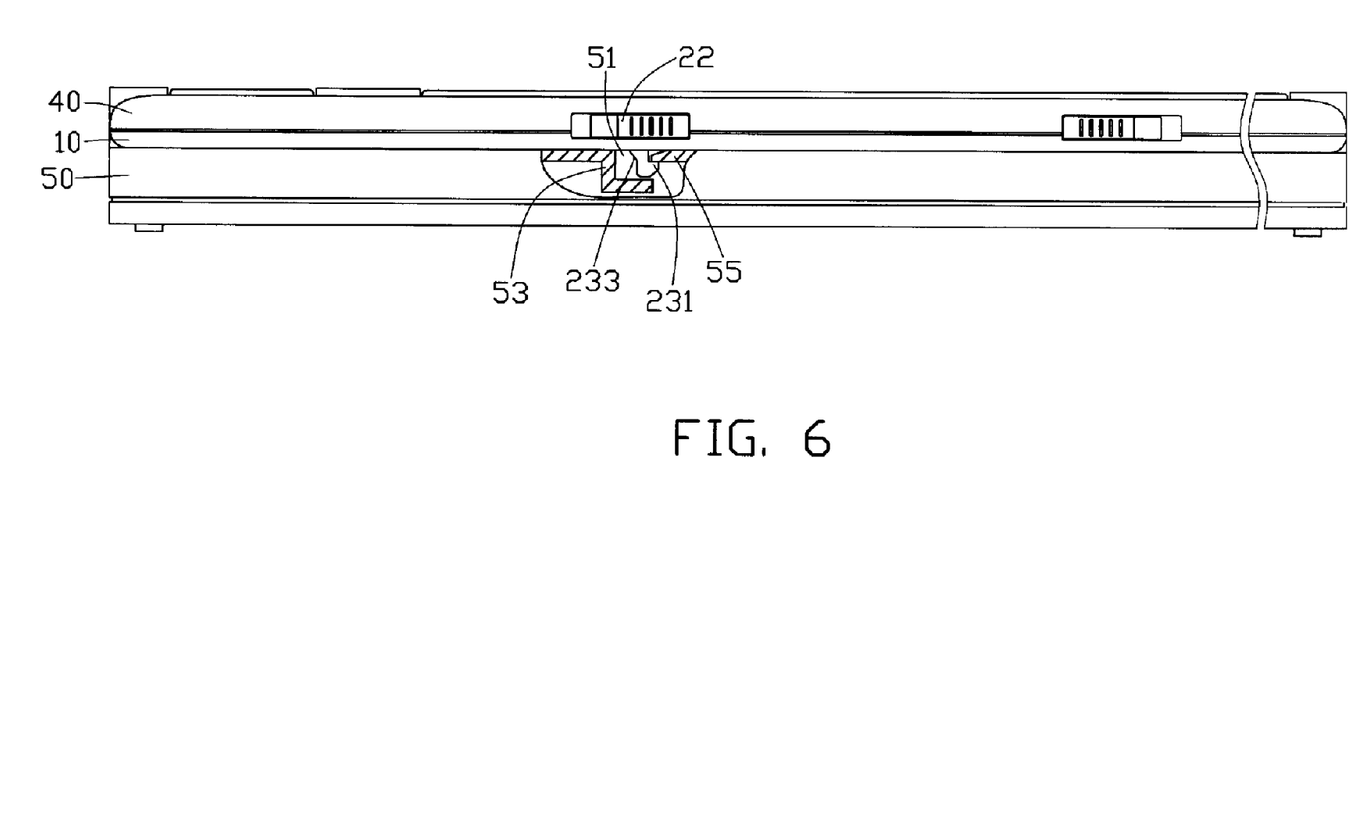
FIG. 6 is a front elevational view showing the cover fixed to a base.

Referring to FIGS. 1 and 6, an electronic apparatus includes a cover, and a base 50 pivotally attached to the cover. The cover includes a frame 10 and a shell 40. A latch mechanism is provided to attach the cover to the base 50. The latch mechanism includes a pair of latches 20 fixed in the cover, and a pair of elastic members 30 corresponding to the latches 20.

Figure 2:
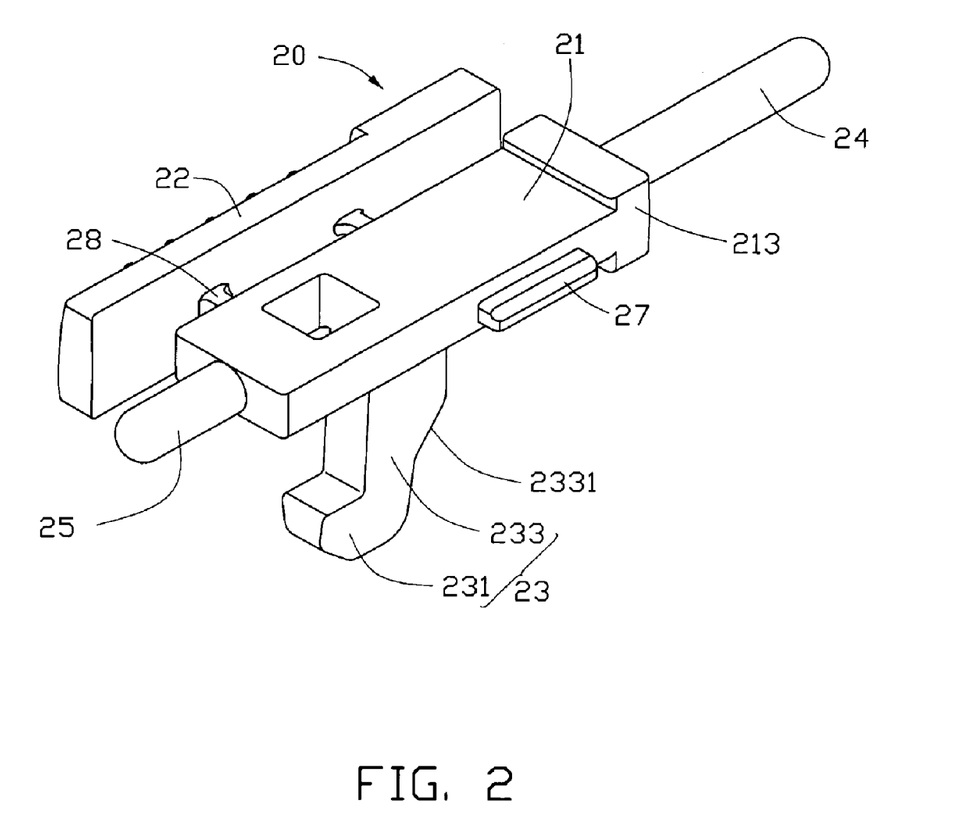
FIG. 2 is an isometric view of the latch of FIG. 1, but viewed from another aspect.

Referring to FIG. 2, each latch 20 includes a main body 21, a switch 22, and a pair of connecting members 28 integrally connecting the main body 21 and the switch 22. A hook 23 depends from a bottom surface of the main body 21. A first post 24 extends from a first end 213 of the main body 21, for extending through a corresponding elastic member 30. A second post 25 extends from a second end of the main body 21. A tab 27 protrudes from a lateral side of the main body 21. The hook 23 includes a shank portion 233 integrated with the main body 21, and a hook portion 231 formed at a distal end thereof parallel to the main body 21 and extending toward the second end of the main body 21. A slanted surface 2331 is defined on a part of a side of the shank portion 233 of the hook 23 facing the first end of the main body 21. An upper point of the slanted surface 2331 is nearest the first end of the main body 21 and a lower point of the slanted surface 2331 is nearest the second end of the main body 21.

Figure 3:
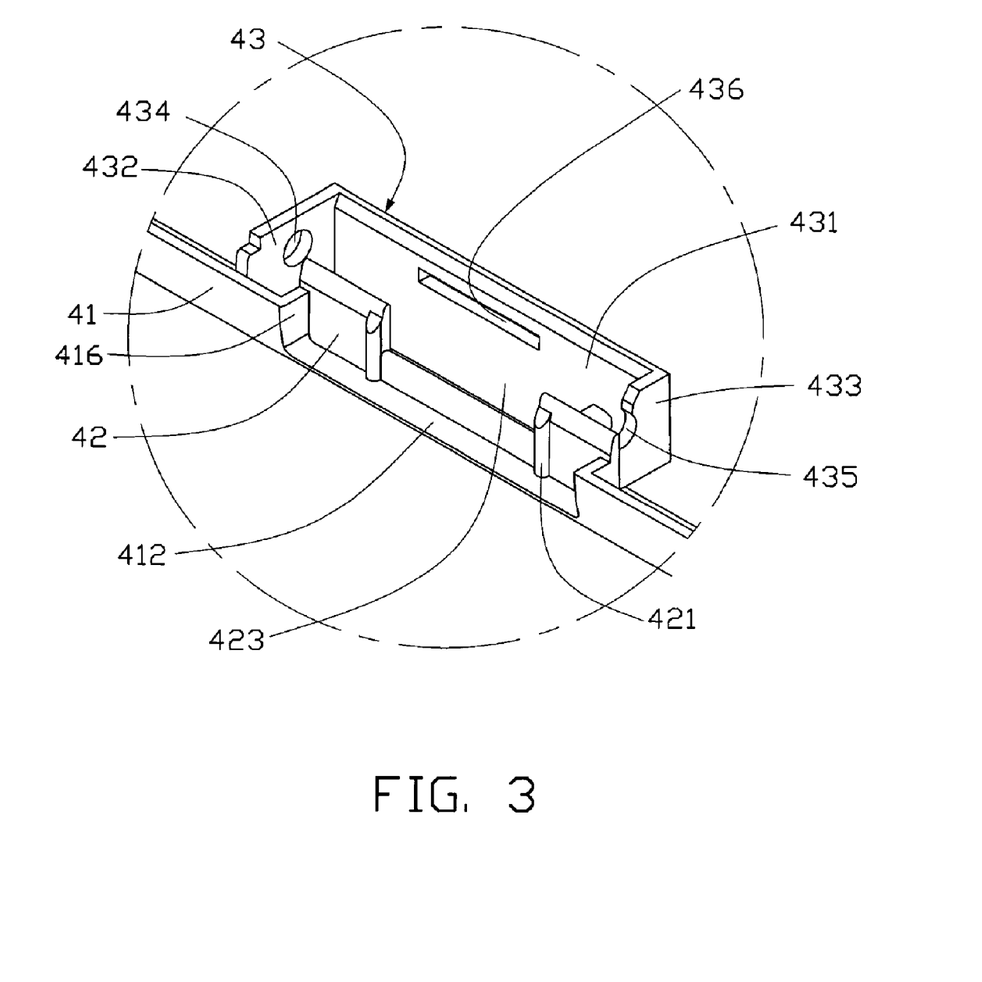
FIG. 3 is an enlarged view of a circled portion III of FIG. 1.

Referring to FIGS. 1 and 3, the shell 40 includes a first wall 412 and a second wall 41 extending up from an edge of the first wall 412. A pair of receptacles 43 are formed in the shell 41, corresponding to the latches 20 and the elastic members 30. Each receptacle 43 includes a sidewall 431, first and second end walls 432, 433 respectively connecting with opposite ends of the sidewall 431, a spacing wall 42 arranged between the sidewall 431 and the second wall 41, and two connecting portions 416 connecting opposite ends of the spacing wall 42 with the second wall 41. The sidewall 431, the first and second end walls 432, 433, and the spacing wall 42 cooperatively define a space for receiving the main body 21 of the corresponding latch 20. The spacing wall 431 and the connecting portions 416 cooperatively define a space for receiving the switch 22 of the corresponding latch 20.

A slot 436 is defined in the sidewall 431 of each receptacle 43, for receiving the tab 27 of the main body 21 of the corresponding latch 20. A hole 434 is defined in the first end wall 432 for allowing extension of the first post 24 of the main body 21 therethrough, and a cutout 435 is defined in the second end wall 433 for receiving the second post 25 of the main body 21. An aperture 423 is defined by cutting out a middle upper portion of the spacing wall 42, for receiving the connecting members 28 of the corresponding latch 20 therein. A pair of ribs 421 is formed adjacent opposite edges of the aperture 423 respectively, for ensuring smooth movement of the switch 22 relative to the spacing wall 42.

Referring back to FIG. 1, two holes 11 are defined in the frame 10 corresponding to the hooks 23 of the latches 20 respectively.

Referring to FIG. 6, a pair of latch holes 51 are defined in the base 50 corresponding to the latches 20 respectively. A pair of retaining portions 55 is formed communicating with each latch hole 51 respectively, corresponding to the hook portions 231 of each latch 20. A pair of stopper portions 53 is respectively formed communicating with each latch hole 51 opposite to the retaining portions 55. In this embodiment, the stopper portions 53 are generally L-shaped in construction.

Figure 4:
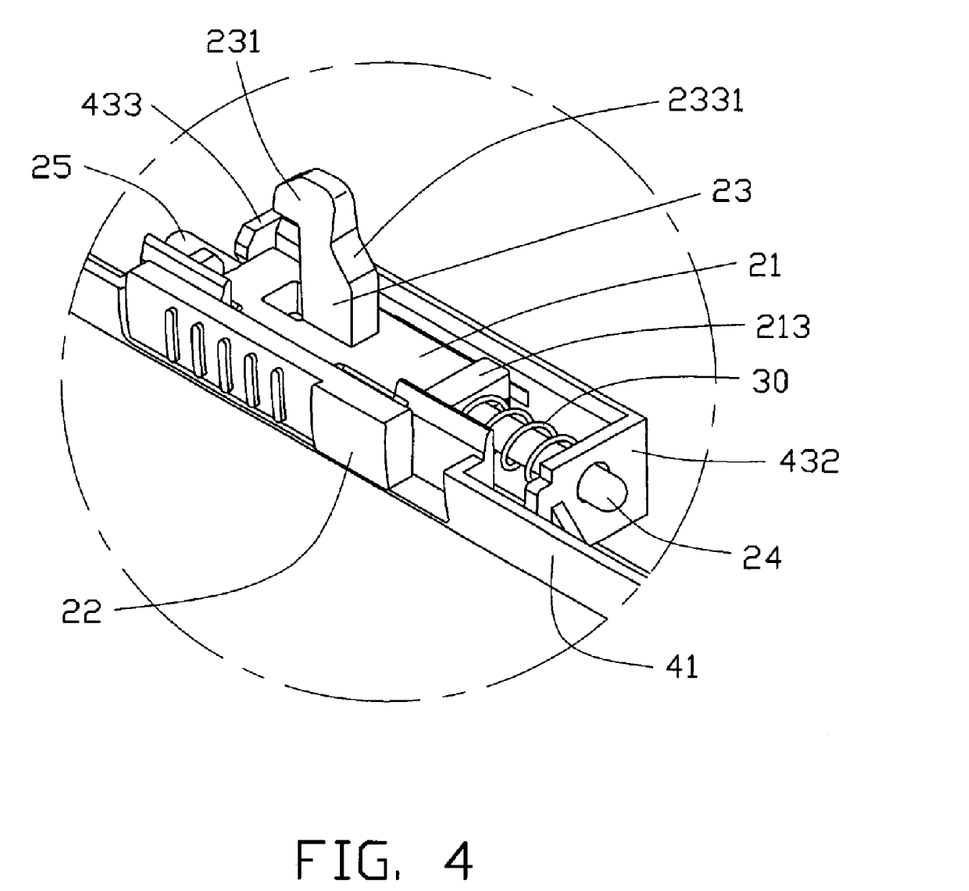
FIG. 4 is an enlarged view of a circled portion IV of FIG. 1.
Figure 5:
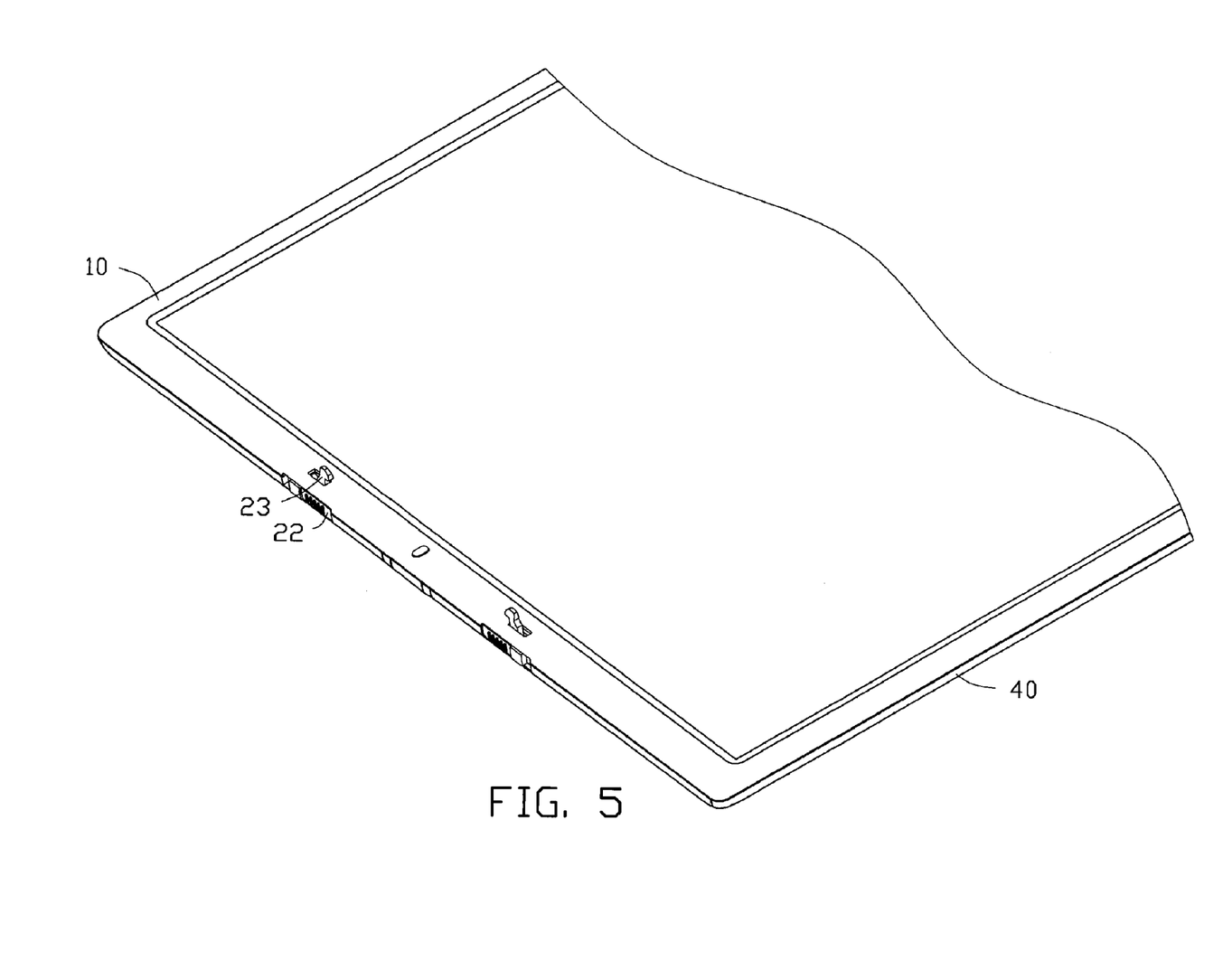
FIG. 5 is an enlarged assembled view of FIG. 1.

Referring to FIG. 4, each latch 20 is assembled in a same way so only one is described herein, the first post 24 of the latch 20 is extended through the elastic member 30. A free end of the first post 24 is extended through the hole 434 of the first end wall 432 of the receptacle 43. The tab 27 of the main body 21 of the latch 20 is received in the slot 436 of the sidewall 431 of the receptacle 43. The second post 25 of the latch 20 is pressed in the cutout 435 of the second end wall 433 of the receptacle 43 and sandwiched therein. The main body 21 and the switch 22 are received in respective spaces defined in the receptacle 43, and the connecting members 28 are supported in the aperture 423 of the spacing wall 42 of the receptacle 43. After both latches 20 have been assembled, the frame 10 is fixed to the shell 40, with the hooks 23 of the latches 20 extending out through the holes 11 of the frame 10 respectively. FIG. 5 shows the assembled cover, with the switches 22 exposed for facilitating manipulation. In this embodiment, the latches 20 are mirror images of each other and assembled in the cover with the hooks 23 facing each other, it can be understood the latches 20 can be identical to each other and assembled with the hooks 23 facing a same direction. The latches 20 can also be arranged in other portions of the cover other than a front portion thereof as required.

Referring to FIG. 6, the cover is pivotally attached to the base 50. The hook portion 231 of the hook 23 of each latch 20 is extended into the respective latch hole 51 of the base 50, and clasps the respective retaining portion 55 of the base 50. The slanted surface 2331 of the hook 23 of each latch 20 faces the respective stopper portion 53 of the base 50.

Figure 7:
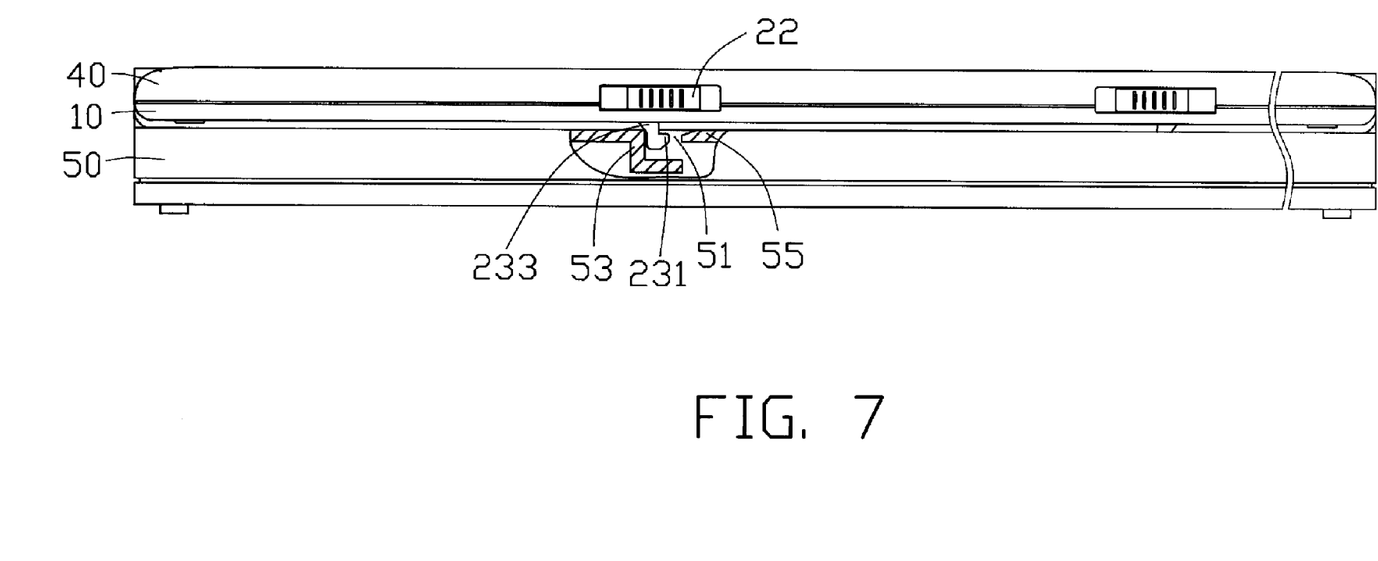
FIG. 7 is similar to FIG. 6, but showing the cover lifted from the base.

Referring to FIG. 7, to open the cover, the switches 22 of the latches 20 are urged laterally to unlatch the hook portions 231 of the hooks 23 from the retaining portions 55 of the base 50 respectively and the slanted surfaces 2331 of the hooks 23 contact with and ride up the stopper portions 53 of the base 50 causing the cover to lift away from the base 50 enough to facilitate grasping the cover and opening it.

Figure 8:
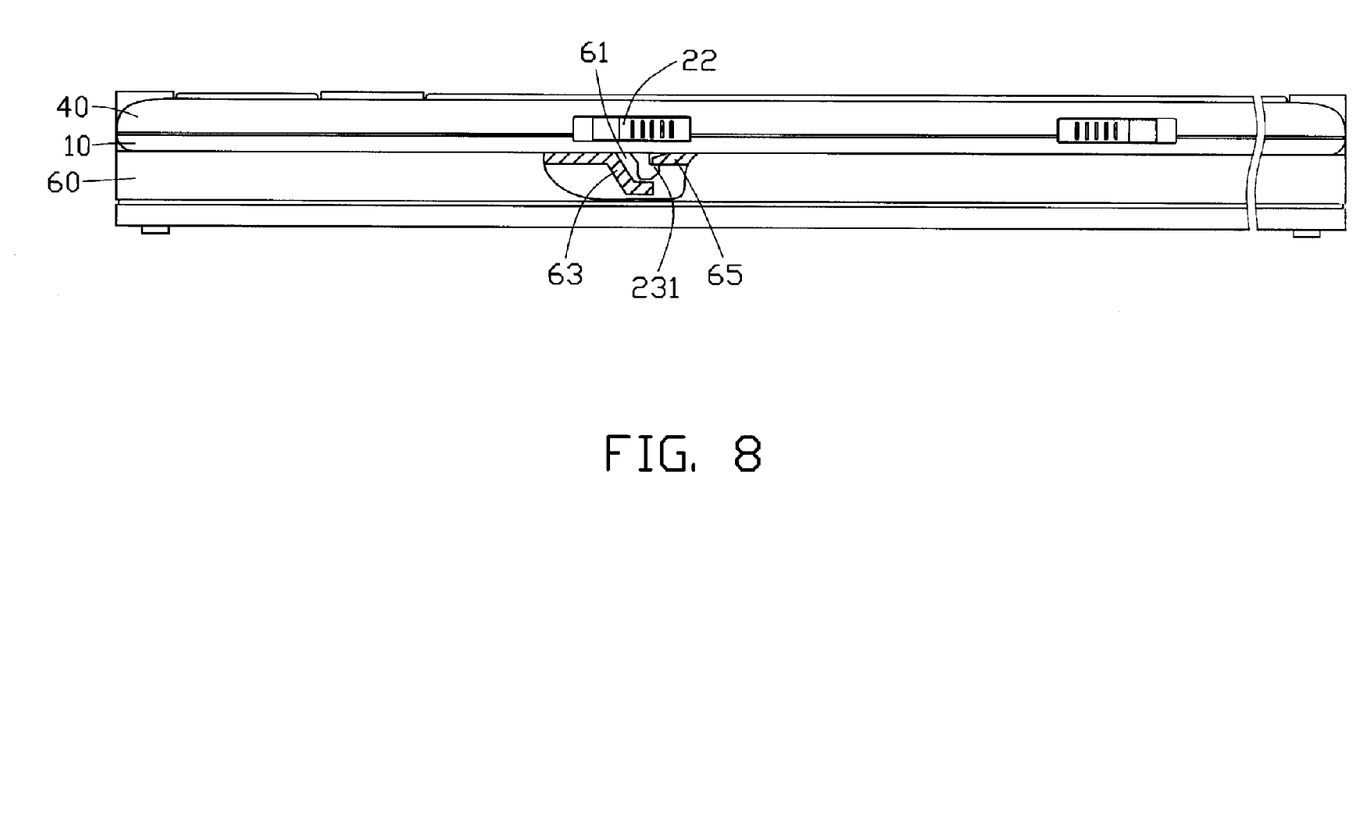
FIG. 8 is a front elevational view of the electronic apparatus in accordance with a second preferred embodiment, showing the cover fixed to a base.
Figure 9:
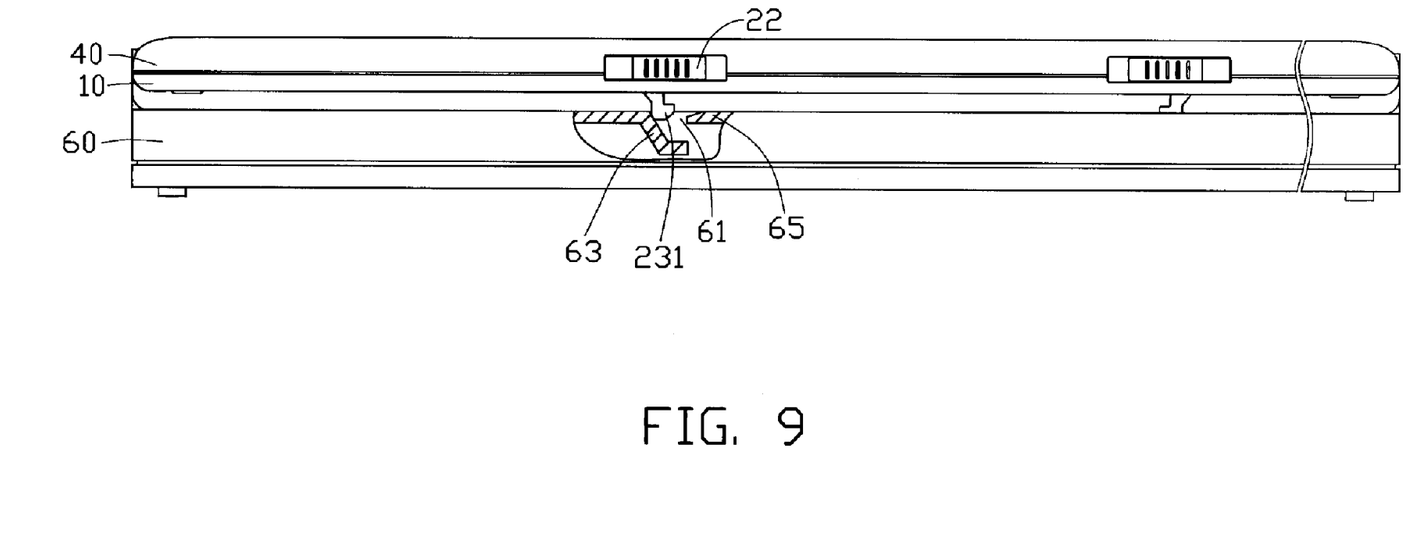
FIG. 9 is similar to FIG. 8, showing the cover lifted from the base.

FIGS. 8 and 9 show an alternative embodiment of the electronic apparatus, the electronic apparatus is similar to the first embodiment except for a base 60. A pair of latch holes 61 is defined in the base 60 corresponding to the latches 20. A retaining portion 65 is formed communicating with each latch hole 61, corresponding to the hook portion 231 of each latch 20. A stopper portion 63 is formed communicating with each latch hole 61 opposite to the retaining portion 65. The stopper portion 63 defines a slanted surface.

To open the cover, the switches 22 of the latches 20 are urged laterally to unlatch the hook portions 231 of the hooks 23 from the retaining portions 65 of the base 60 respectively, and cause the hooks 23 to ride up along the slanted surface of the stopper portions 63 thereby causing the cover to lift away from the base 60 enough to facilitate grasping the cover and opening it.

Alternatively, the latches 20 is installed in the base 50 instead of the cover. Movement of the latches 20 is able to push the cover away from the base 50 in order to conveniently lift the cover.

It is believed that the present embodiments and its advantages will be understood from the foregoing description, and it will be apparent that various changes may be made thereto without departing from the spirit and scope of the invention or sacrificing all of its material advantages, the embodiments and examples hereinbefore described merely being preferred or exemplary embodiments with exemplary detail.

What is claimed is:

1. An electronic apparatus comprising:
   a cover;
   a latch fixable to the cover, the latch comprising a hook having a shank portion and a hook portion extendable from the shank portion, the shank portion defining a slanted surface on at least one part thereof; and
   a base pivotally connectable with the cover, the base comprising a retaining portion engagable with the hook portion of the latch for fixing the cover to the base, and a stopper portion along which the slanted surface of the shank portion is movable thereby causing the cover to lift away from the base;
   wherein the slanted surface and the hook portion are arranged at different sides of the shank portion of the hook of the latch.

2. The electronic apparatus as claimed in claim 1, wherein a lower point of the slanted surface of the shank portion is nearer to the hook portion than an upper point thereof in a direction in which the hook portion extends.

3. The electronic apparatus as claimed in claim 1, wherein a receptacle is formed in the cover, the latch comprises a main body movably received in the receptacle, and the hook is formed on the main body.

4. The electronic apparatus as claimed in claim 3, wherein an elastic member is arranged in the receptacle to actuate the main body of the latch.

5. The electronic apparatus as claimed in claim 3, wherein the receptacle comprises a sidewall defining a slot therein, a tab is extended from a side surface of the main body and received in the slot of the sidewall for guiding movement of the latch.

6. The electronic apparatus as claimed in claim 3, wherein the latch further comprises a switch connectable with the main body thereof for being manipulated, a spacing wall is formed to divide the receptacle into two spaces respectively receiving the switch and the main body of the latch.

7. An electronic apparatus comprising:
   a cover;
   a latch installable in the cover and slidable in a first direction, the latch comprising a hook; and
   a base pivotally connected with the cover, the base comprising a retaining portion engagable with the hook of the latch for fixing the cover to the base when the latch is slid in the first direction, and a stopper portion defining a slanted surface along which the hook is urged to ride up in a second direction for causing the cover to lift away from the base in a third direction different from the first and second direction;
   wherein the hook comprises a shank portion and a hook portion extending from the shank portion, the hook portion of the hook engages with the retaining portion thereby fixing the cover to the base;
   wherein a slanted surface is defined on the shank portion of the hook, and the slanted surface of the hook and the hook portion are arranged at opposite sides of the shank portion of the hook of the latch.

8. The electronic apparatus as claimed in claim 7, wherein a receptacle is formed in the cover, the latch comprises a body movably received in the receptacle, and the hook is formed on the main body.

9. The electronic apparatus as claimed in claim 8, wherein the receptacle comprises opposite first and second end walls, the first wall defines a hole therein, the second end wall defines a cutout therein, first and second post extends from opposite ends of the body of the latch slidably receivable in the hole and cutout respectively.

10. The electronic apparatus as claimed in claim 8, wherein the latch further comprises a switch connectable with the body thereof for being manipulated, a spacing wall is formed to divide the receptacle into two spaces respectively receiving the switch and the body of the latch.

11. An electronic apparatus comprising:
- a base of said electronic apparatus enclosing a first part of said electronic apparatus therein;
- a cover of said electronic apparatus enclosing a second part of said electronic apparatus therein, and movably attachable to a side of said base in order to be movable along a first direction between a first position of said cover where said cover abuts against said side of said base to cover thereon, and a second position of said cover where said cover is away from said side of said base to reveal said side of said base; and
- a latch installable in a selective one of said cover and said base, and movable along a second direction different from said first direction of said cover so as to disable a first engagement between said latch and the other of said cover and said base for securing said cover to said base, and to enable a second engagement between said latch and said other of said cover and said base for urging said cover to move along said first direction;
- wherein said latch comprises a hook extending toward said other of said cover and said base to perform said first engagement in order to secure said cover to said base;
- wherein a selective one of said latch and said other of said cover and said base defines a slanted surface to perform said second engagement in order to urge movement of said cover along said first direction.

* * * * *